US006268297B1

(12) United States Patent
Nag et al.

(10) Patent No.: US 6,268,297 B1
(45) Date of Patent: Jul. 31, 2001

(54) SELF-PLANARIZING LOW-TEMPERATURE DOPED-SILICATE-GLASS PROCESS CAPABLE OF GAP-FILLING NARROW SPACES

(75) Inventors: Somnath S. Nag, Saratoga, CA (US); Gregory B. Shinn, Dallas; Girish A. Dixit, Plano, both of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/196,725

(22) Filed: Nov. 20, 1998

Related U.S. Application Data

(60) Provisional application No. 60/066,615, filed on Nov. 26, 1997.

(51) Int. Cl.[7] ................................................. H01L 21/469
(52) U.S. Cl. ............................................ 438/783; 438/434
(58) Field of Search ................................. 438/424, 433, 438/435, 783, 434, 453, 788; 257/641

(56) References Cited

U.S. PATENT DOCUMENTS

| 5,621,241 | * | 4/1997 | Jain ....................................... 257/632 |
| 5,937,322 | * | 8/1999 | Orczyk et al. ........................ 438/624 |
| 6,030,881 | * | 2/2000 | Papasouliotis et al. ............. 438/424 |

OTHER PUBLICATIONS

S. Wolf and R.N. Tauber., Silicon Processing, Lattice Press, vol. 1, pp 188, 1986.*

* cited by examiner

Primary Examiner—David Nelms
Assistant Examiner—Quoc Hoang
(74) Attorney, Agent, or Firm—Jacqueline J. Garner; W. James Brady, III; Frederick J. Telecky, Jr.

(57) ABSTRACT

A low-temperature pre-metal dielectric deposition process using phosphine-based chemistry in a high-density plasma chemical-vapor deposition technique. The process uses a phosphorous-doped oxide of up to 3.5 percent (wt) deposited at less than 350 degrees C. capable of filling 0.4 micron spaces between poly-silicon gates without microvoids.

15 Claims, 6 Drawing Sheets

US 6,268,297 B1

SELF-PLANARIZING LOW-TEMPERATURE DOPED-SILICATE-GLASS PROCESS CAPABLE OF GAP-FILLING NARROW SPACES

This application claims priority under 35 USC § 119 (e) (1) of provisional application number 60/066,615, filed Nov. 26, 1997.

BACKGROUND AND SUMMARY OF THE INVENTION

The present invention relates to integrated circuit structures and fabrication methods.

BACKGROUND

Increased surface density and more surface layers made possible the advancement of circuits to VLSI densities, and more recently, ULSI levels. Due to shrinking gate lengths and inter-poly spaces, there has arisen a need for a phosphorous-doped oxide deposition process capable of filling the less than 0.5 micron gaps between polysilicon lines. Requirements for pre-metal dielectric ("PMD") layers have to be reviewed as devices shrink even further, below the 0.25 micron generation, due to limited depth-of-focus, planarity, low thermal budget, and gap-fill of such small dimensions.

Moreover, with regard to transistor fabrication, since the distances between the source and drain are smaller and the junctions are shallower, there is also a second requirement of a low thermal budget after the transistors have been built. The doped dielectric layer used to isolate transistors from the overlying interconnect module are critical for electrical insulation as well as for gettering contamination which may change device characteristics. With shrinking inter-poly spaces, a void-free gap-fill pre-metal dielectric process is more important since any voids could open up during contact etch and cause metal filaments, as shown in FIG. 4.

A low temperature pre-metal dielectric is essential due to the requirements for a low thermal budget process after transistor formation. Problems with the standard plasma CVD-PSG (chemical-vapor deposition - phosphosilicate glass) process have been, 1) gap-filling, 2) film stability, and 3) planarization.

A low temperature PMD process, in particular, is imperative to maintain low silicide sheet resistances, shallow junctions, low contact resistances, low fixed-charge density (high Cinv/Cox), high drive currents, and reduce dopant de-activation. Conventional techniques, such as reflowed boro-phosphosilicate glass ("BPSG") and plasma enhanced PSG ("PEPSG"), used thus far, fail to meet these criteria.

High-Density Plasma

Integrated circuit processing with high-density-plasma ("HDP") is currently a very active area of research. The key difference between HDP conditions and the plasma conditions formerly used in integrated circuit processing is the ionization percentage: under HDP conditions the ratio of ions to neutral species near the surface of the wafer (outside the dark space) will typically be 10 percent or more, as compared to a much smaller ionization percentage in conventional plasma reactors. This higher ionization fraction is typically achieved by using an RF power input for ionization which is not applied directly to the wafer surface. In addition, a second RF power input is applied to the wafer surface (through the conductive susceptor which holds the wafer), to apply a voltage to ion bombardment. (Note that the gas pressure under HDP conditions is not necessarily higher than in conventional plasma processing; indeed gas pressure under HDP conditions is often less than 100 milliTorr, since low pressures produce a longer mean free path and reduce recombination.)

Innovative Structures and Methods

The present application discloses a process using a high-density-plasma ("HDP") environment such that a phosphorous-doped oxide, preferably with less than 4 percent (wt) can be deposited at less than 350 degrees C. The gap-fill is superior, self-planarization is evident, and film stability is good. This process is capable of filling the 0.4 micron spaces between the polysilicon gates or narrow lines without leaving any voids.

The disclosed low-temperature (less than 400 degrees C.) pre-metal dielectric scheme is shown to have a significant impact on simplifying process-integration and improving device yield. Moreover, this plasma CVD technique also has better native planarity, which reduces as-deposited topography and therefore the CMP polish time. The superior planarity of this PMD process reduces electrical defects at metallization and therefore improves the yield of good electrical die; it also eliminates the need for boron doping of the PMD layer and a high temperature anneal for reflow. The self-planarizing nature of the process reduces the amount of CMP polish time, which in turn reduces the cost of manufacture of the PMD level. Device and contact characteristics are shown to be superior to high-temperature PMD processes. This HDP process is found to have acceptable plasma damage performance comparable to parallel-plate plasma processes. Analysis of SRAM devices indicate that the yield for this low temperature PMD process was well over twice that for the conventional plasma enhanced PSG scheme. A further advantage is that high concentrations of phosphorous are avoided, which has the ability to create phosphoric acid with the introduction of moisture. Low temperature PMD is required for reduced contact and poly sheet resistance and improved Cinv/Cox. Gap-fill and planarity requirements are also stringent at sub-0.25 micron. The HDP-PSG scheme is shown to be electrically superior as well as simplifying process integration. Another advantage is this low-temperature PMD process is applicable to devices with 0.18 micron nodes.

BRIEF DESCRIPTION OF THE DRAWINGS

The disclosed inventions will be described with reference to the accompanying drawings, which show important sample embodiments of the invention and which are incorporated in the specification here of by reference, wherein.

DETAILED DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Overview

Figure 1:
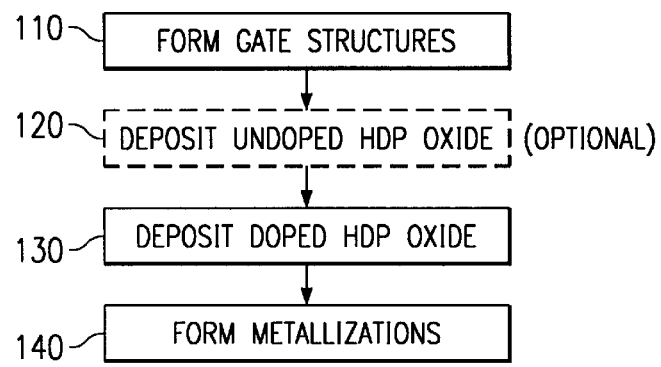
FIG. 1 shows a flowchart of the disclosed process.

FIG. 1 shows a flowchart of the steps of the disclosed process. In step 110, gate structures are formed on a semiconductor material. Then, in optional step 120, a thin layer of an undoped oxide is deposited by HDP-CVD over the wafer. This layer, when used, provides a buffer between the doped oxide to follow and the substrate and allows a greater concentration of dopant in the subsequent layer. This is followed in step 130 by HDP-CVD deposition of a phosphorus-doped oxide. Using HDP conditions provides the advantages listed above. Finally, the metallization is formed over the doped oxide in step 140 and processing continues.

Preferred Embodiment

The typical scheme used for the disclosed process is 60 nm of undoped oxides over the gates, 1090 nm of PMD phosphorous doped oxide which is then polished using CMP to leave about 600 un over the poly. A two-step approach is used, with the first gap fill step is done with an undoped HDP-CVD process step. Once the gap fill is complete, a PH3 chemistry is layered on such that the overlayer is a phosphorous-doped film which will serve as a barrier to mobile-ions that may be in the vicinity of transistors. The main advantage of the two-step system is that much higher phosphorous content is possible in an oxide film which does not have gap-fill requirements, i.e., the gap filling capability of a phosphorous-doped oxide deposition process reduces as the phosphorous content increases.

The process which uses the following recipe is found to be capable of gap-filling 0.4 micron spaces at the polysilicon gate level (even without sidewall spacers) as well as self-planarizing to a step height of less than 300 nm.
Phosphorous/Silicon Source Flow 3:0 sccm of 10 percent PH3/SiH4;
Oxygen Source Flow: 57 sccm of 02;
Inert Flow: 5 sccm of Ar;
RF power: 3000 Watts per square cm;
Bias RF: 0 Watts;
Helium cooling pressure: 2000–5000 milliTorr
Film characteristics: Phosphorus concentration of 3.6 percent wt Following is a comparison of a film formed by the disclosed HDP-CVD process with a conventional high-temperature BPSG film and a low-temperature plasma enhanced PSG film:

A robust low-temperature PMD dielectric film is first developed using a PH3/SiH4 chemistry in a high density plasma CVD process, as given above. Evolution of weakly bonded species was measured with Thermal Desorption Spectroscopy ("TDS") while the films were held at up to 800 degrees C. for up to 60 minutes. Changes in FTIR (Fourier-Transform Infrared spectroscopy) scans taken beforehand after such temperature cycling as well as with DI-H20 (65 degrees C.) dips were used as an indicator of changes in the oxide film. Polysilicon line arrays with 0.2–0.3 micron spacing and aspect ratios between 1–2 were used to evaluate the gap-filling performance of the PMD processes. A twin-well salicided CMOS integration scheme was used to fabricate 0.18 micron devices. Following the final anneal of the contact silicide, poly-metal dielectric isolation was formed using a number of schemes. In all cases, a thin undoped oxide layer was used prior to doped oxide PMD deposition.

The doped oxides compared in this process are: 1) conventional parallel-plate plasma enhanced phosphosilicate glass (5 percent wt phosphorus)("PEPSG"), and 2) HDP deposited PSG (0–4 percent wt phosphorus). Subsequent metallization consisted of W-plug contacts and Al—Cu interconnects followed by two more levels of all aluminum metallization. Corresponding polysilicon line/space structures were used to evaluate the gap-filling performance of the PMD processes.

Film Stability

Figure 2:
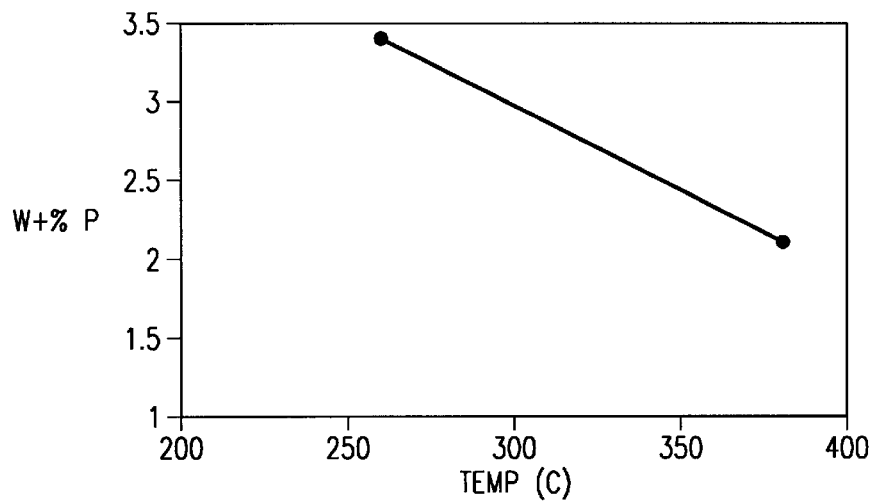
FIG. 2 shows a plot of percent (wt) phosphorous versus deposition temperature in HDP-PSG.
Figure 3:
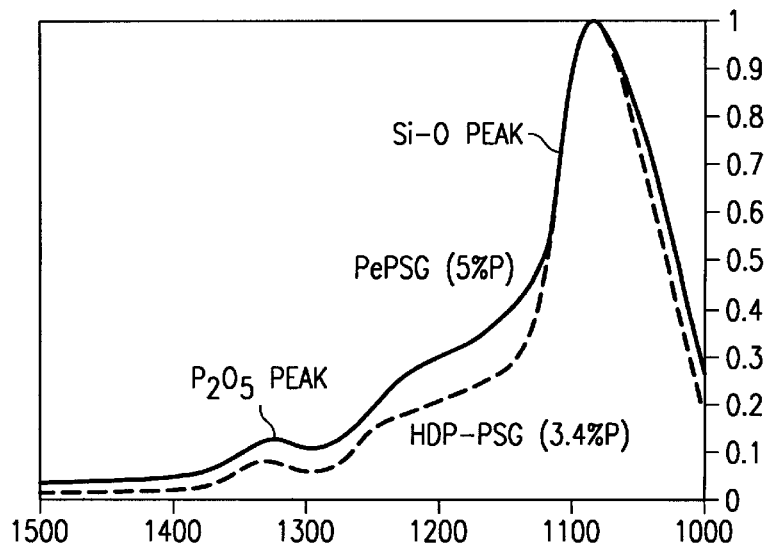
FIG. 3 shows a comparison of BPSG and low-T PMD FTIR spectra.
Figure 4:
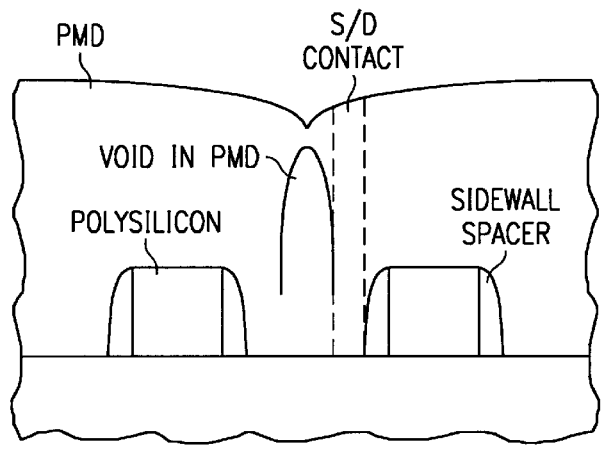
FIG. 4 shows a diagram of how a void can affect contact integration.

The phosphorous content of the HDP-PSG films developed were controlled between 2–4 percent wt by changing process parameters, as shown in FIG. 2. Two such processes with 2.1 and 3.4 wt percent phosphorus were considered. Phosphorus was found to be in it's stable P205 form as seen from the single P—O peak at 1330 cm−1 in FTIR scans taken on the as-deposited films. TDS measurements on such films showed no significant evolution during anneals at 500 degrees C. for 60 minutes. ICP-AES (Inductively Coupled Plasma—Auger Electron Spectroscopy). and Colorimetry analysis indicated that the phosphorous content remained constant even after the anneal. The P205 peak in the FTIR scan in FIG. 3 was found to become significantly tighter and deconvoluted from the Si—O peak, following the 500 degree C. anneal. This is indicative of the fact that the P—O bonds in the oxide achieve a tighter distribution of stable bond-lengths, angles, and strengths. Also, since the PMD will be subject to subsequent metallization cycles at about 450 degrees C., this will improve the quality of the PMD oxide. The PEPSG films were seen to have characteristics comparable to the HDP-PSG except that they are more hygroscopic.

Gap-Filling Characteristics

In the case of the HDP-PSG films, the gap-filling was seen to be void-free for the 0.25 micron spaces between polysilicon gaps. The CMP removal and polish time to achieve similar planarity is found to be much lower for the HDP-PSG process as shown by the following table:

| Process | Pre-CMP step ht. | CMP removal | Post-CMP step ht. |
|---|---|---|---|
| BPSG | 270 nm | 450 nm | <50 nm |
| PEPSG | 270 nm | 450 nm | <50 nm |
| HDP-PSG | 280 nm | 250 nm | <50 nm |

The reduced CMP oxide removal required for HDP-PSG also implies that a thinner starting thickness of PMD can be deposited in this case, thereby reducing overall process time for PMD.

Figure 5:
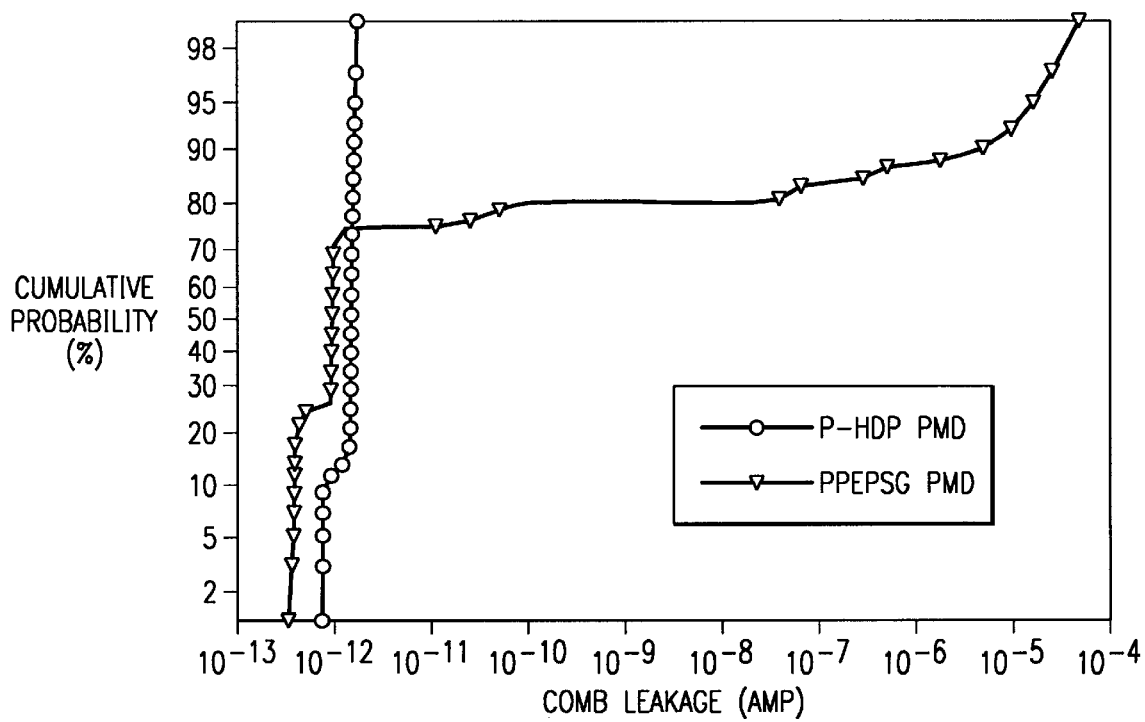
FIG. 5. shows a plot of leakage currents showing yield improvement for the P-HDP gapfilled PMD compared to the PEPSG PMD.
Figure 6A:
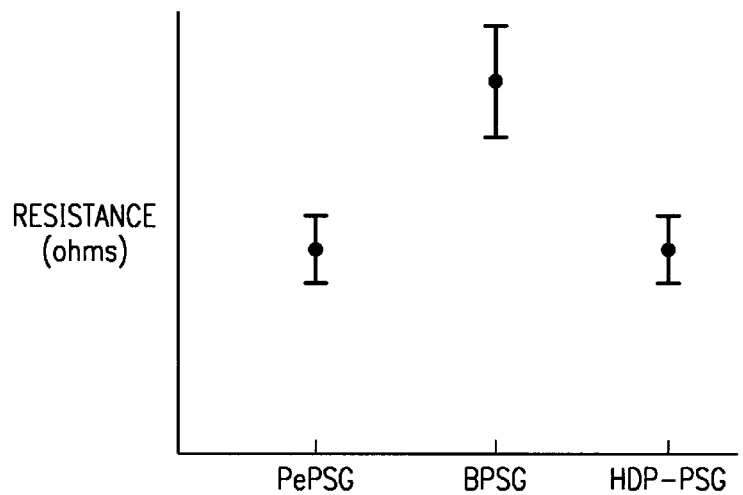
FIG. 6A shows a plot of contact resistance distribution for the PEPSG, BPSG, and HDP-PSG processes.
Figure 6B:
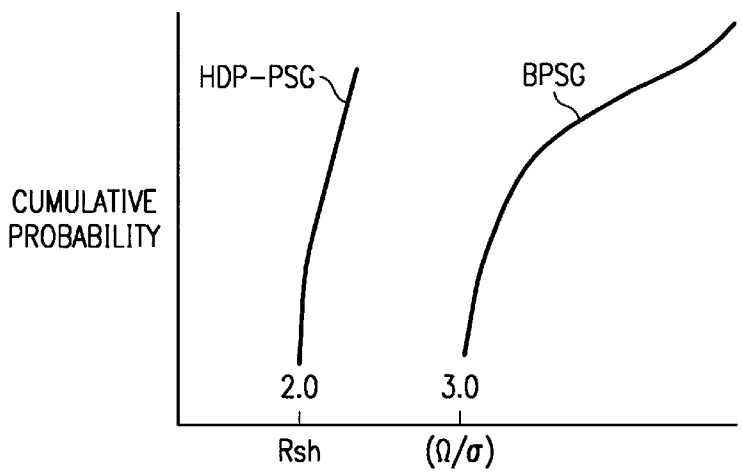
FIG. 6B shows a plot of polysilicon sheet resistances for HDP-PSG and BPSG processes.
Figure 7:
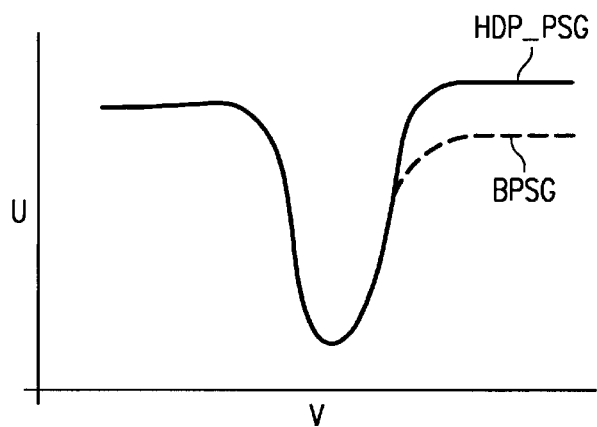
FIG. 7 shows a plot of Cinv/Cox for low and high temperature pre-metal dielectric process.
Figure 8:
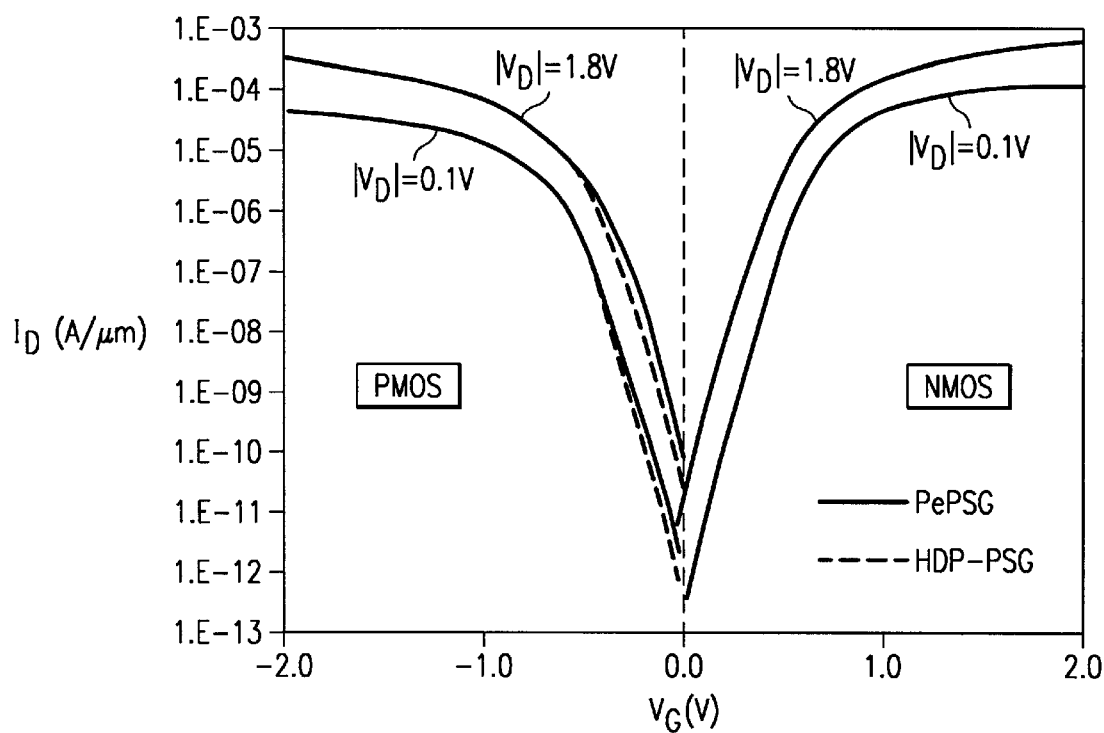
FIG. 8 shows a plot of NMOS and PMOS transistor drain current (Id) versus gate voltage (Vg) for both the HDP-PSG process and the PEPSG process.
Figure 9:
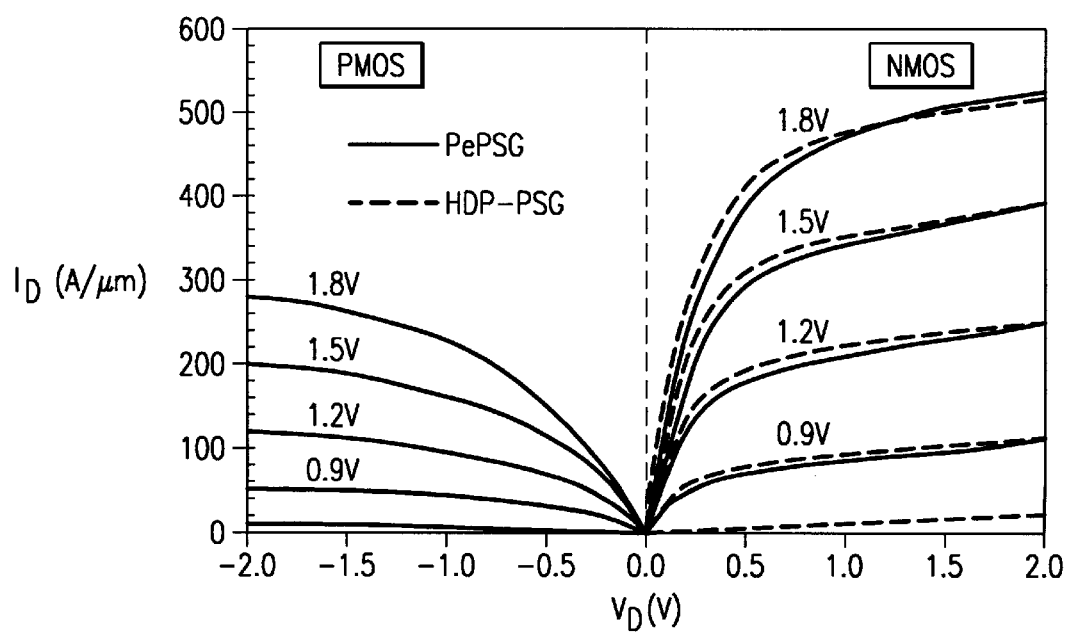
FIG. 9 shows a plot of NMOS and PMOS transistor drain current (Id) versus drain voltage (Vd) for both the HDP-PSG process and the PEPSG process.
Figure 10A:
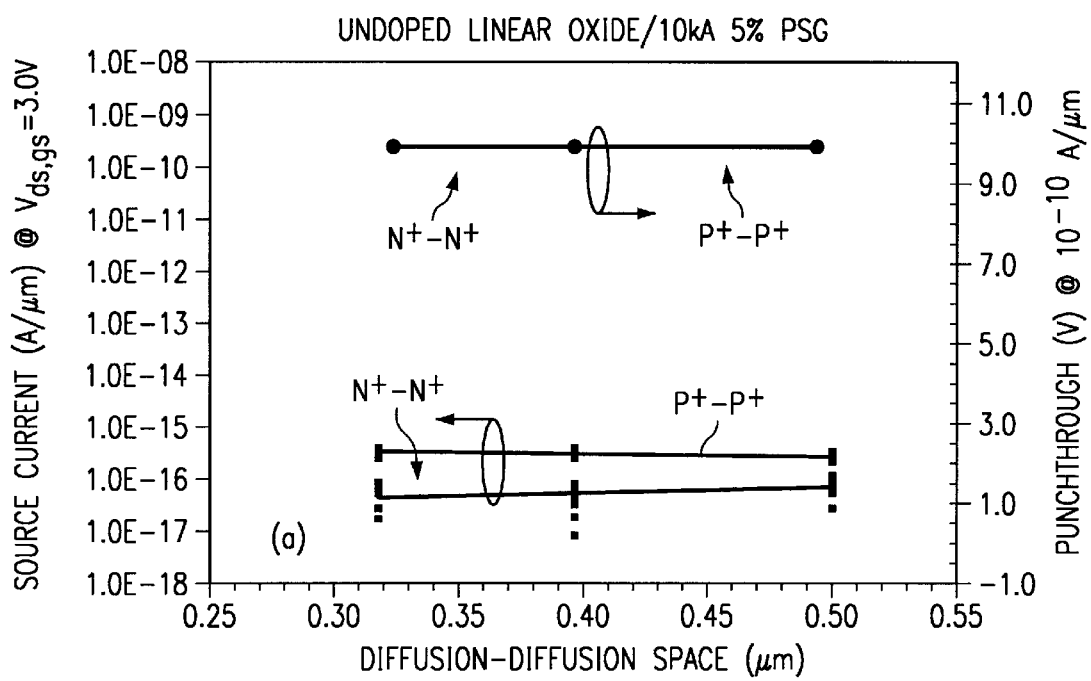
FIGS. 10A and 10B show plots of moat-well isolation characteristics for PePSG and HDP-PSG,respectively.
Figure 10B:
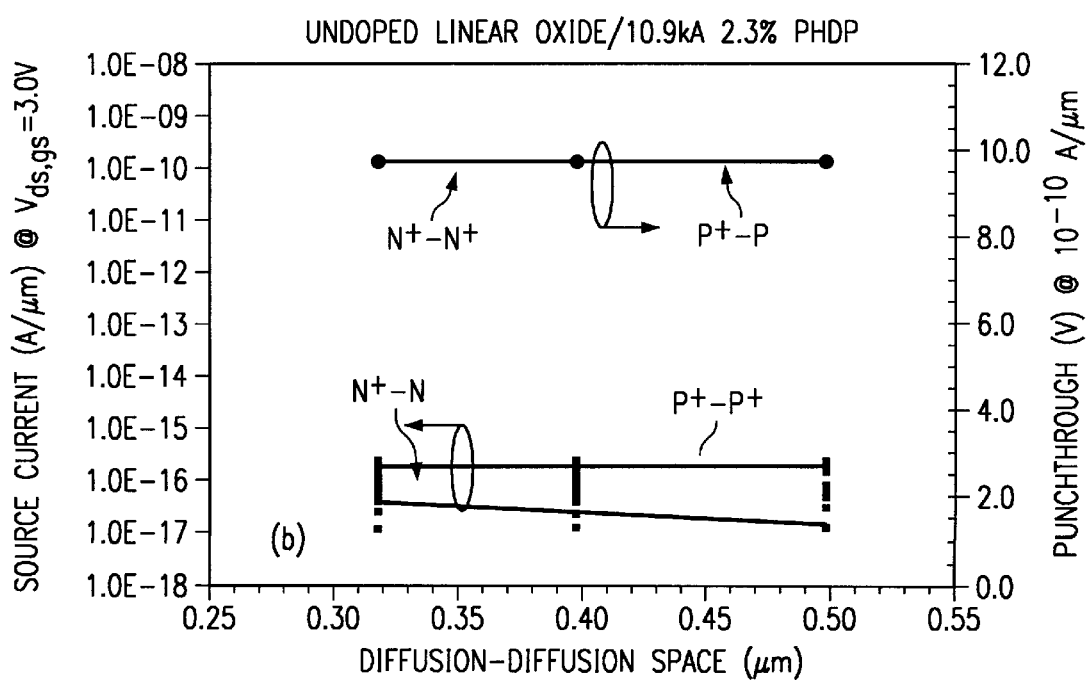
Figure 11:
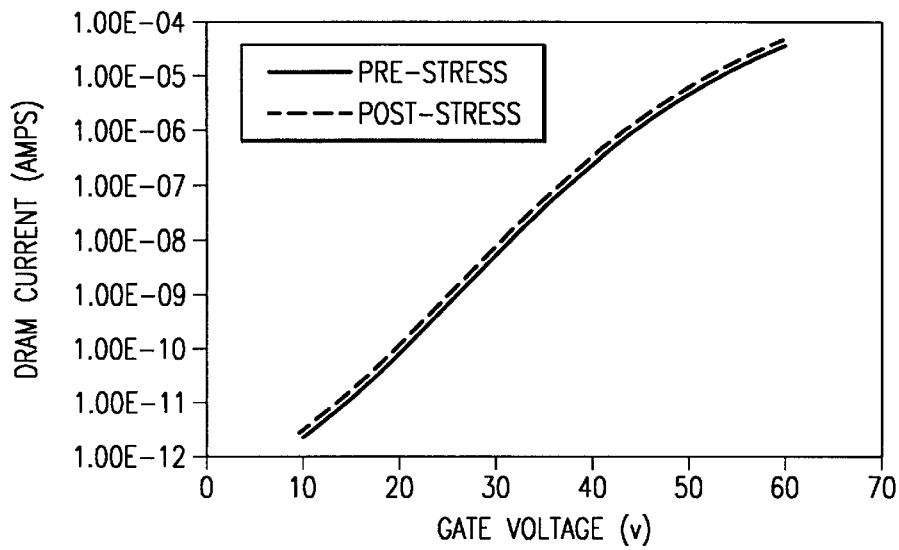
FIG. 11 shows a plot of bias-temperature stress for capacitance versus voltage for HDP-PSG after mobile-ion stress.
Figure 12:
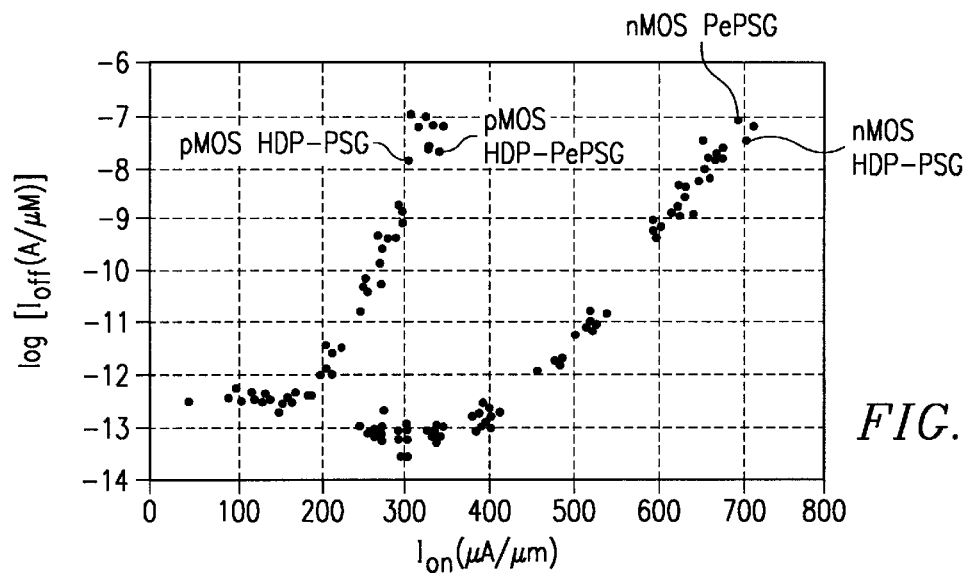
FIG. 12 shows a plot of Ion/Ioff characteristics for transistors using HDP-PSG and PEPSG PMD.
Figure 13:
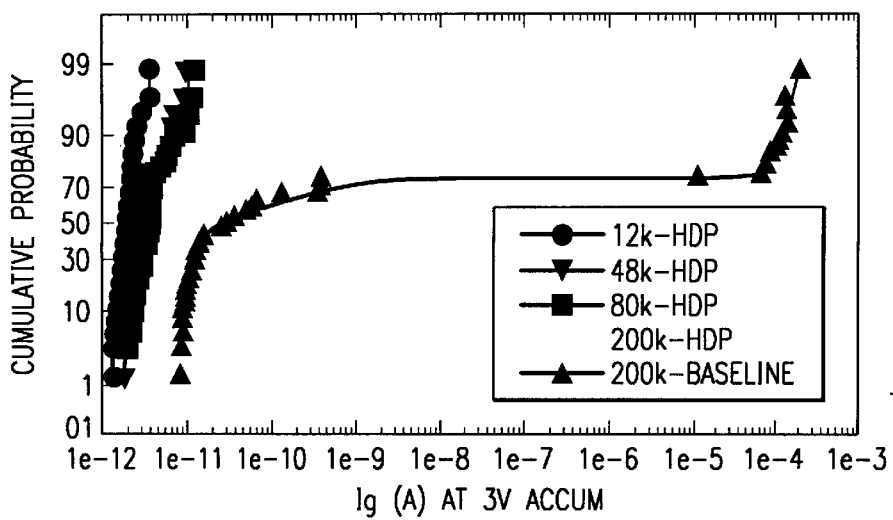
FIG. 13 shows a plot of cumulative Vt for antenna structures for plasma damage tests.

FIG. 5 shows a plot of leakage currents measured for 0.24/0.25 micron L/S metal comb structure with underlying SRAM topography showing yield improvement for the P-HDP gapfilled PMD compared to the PEPSG PMD. The serpent-comb yield data in this figure shows that the PEPSG scheme has a poor yield compared to the HDP-PSG case. This is believed to be a result of a seam in the PEPSG gap-fill which causes metal filaments after etch. The seamless planar surface of the HDP-PSG process alleviates this problem. Similarly, lower contact and polysilicon sheet resistances are shown in FIGS. 6A and 6B for the HDP-PSG scheme. FIG. 7 shows that the Cinv/Cox for the two low-temperature processes is higher as compared to the conventional BPSG scheme. Transistor performance for the PMD process is compared to the PEPSG process in both FIGS. 8 and 9. FIG. 8 shows drain current (Id) plotted against gate voltage (Vg), while FIG. 9 shows drain current plotted against drain voltage (Vd). Curves for PMOS and NMOS transistors show no degradation with the use of the HDP-PSG process. This is also supported by the Vt rolloff curve shown in FIG. 12. Controlled experiments performed to test for mobile-ion gettering performance were found to be comparable to the conventional scheme although the phosphorous content for the low-temperature HDP-PSG scheme is lower. Bias-temperature stress tests done on capacitor structures are shown in FIG. 11. Isolation characteristics are found to be unaffected by this proposed low-temperature plasma process at PMD, as seen in FIGS. 10A and 10B. Plasma damage testing on large antenna structures indicates no potential issues with transistor degradation. This is seen in the cumulative distribution plots for Vt shift shown in FIG. 13.

Process Comparison

A comparison of conventional high temperature BPSG, low-temperature PEPSG, and HDP-PSG processes shows that low-temperature processing at PMD improves sheet and contact resistances as well as Cinv/Cox. Moreover, the proposed HDP-PSG process which has excellent self-planarizing and gap-fill performance, is required at the 0.18 μm node in order to ensure high yields and reduced process time.

Alternate Embodiment

The phosphorous-doped process discussed above can alternatively be implemented using a single-step approach. This requires a homogeneous single deposition step in which gap-fill and over-layer deposition up to the required thickness takes place and where all the oxide is phosphorous-doped. However, this method is less desirable, because a lower phosphorous content is necessary to meet the needed gap-fill requirements.

Modifications and Variations

As will be recognized by those skilled in the art, the innovative concepts described in the present application can be modified and varied over a tremendous range of applications, and accordingly the scope of patented subject matter is not limited by any of the specific exemplary teachings given, but is only defined by the issued claims.

Similarly, while the contact from first metal to poly and active has been particularly described, it will be readily recognized that the disclosed inventions are equally applicable to processes with multiple layers of metal (and in fact would be most commonly used in such processes).

Similarly, it will be readily recognized that the described process steps can also be embedded into hybrid process flows, such as BiCMOS or smart-power processes.

What is claimed is:

1. A method of fabricating an integrated circuit structure, comprising the steps of:
   (a.) forming a plurality of polysilicon lines having a desired spacing and a desired aspect ratio;
   (b.) depositing a layer of doped silicate glass over said plurality of polysilicon lines, using a high-density plasma chemical vapor deposition process with a temperature less than 350° C.;
   whereby said method provides gap-fill and planarization which is superior to that provided by a plasma-enhanced chemical vapor deposition process.

2. The method of claim 1, further comprising the step of:
   (a1.) prior to step (b.), depositing a layer of undoped silicate glass over said plurality of polysilicon lines, using a high-density plasma chemical vapor deposition process.

3. The method of claim 1, wherein said doped silicate glass has a phosphorous doping of greater than or equal to two percent wt.

4. The method of claim 1, wherein said doped silicate glass has a phosphorous doping of less than or equal to 4 percent wt.

5. The method of claim 1, wherein the distance between ones of said plurality of polysilicon lines is no more than 0.4 microns.

6. The method of claim 1, wherein said aspect ratio is between about 1 and 2.

7. The method of claim 1, wherein said plurality of polysilicon lines have no sidewall spacers.

8. The method of claim 1, further comprising the subsequent step of depositing metallization over said dielectric layer.

9. The method of claim 1, wherein the distance between ones of said plurality of polysilicon lines is no more than 0.4 microns and said aspect ration is between about 1 and 2.

10. The method of claim 1, wherein the temperature of said depositing step is less than 350 degrees C.

11. The method of claim 1, wherein said plurality of polysilicon lines have no sidewall spacers.

12. A method of fabricating an integrated circuit structure, comprising the steps of:
   (a.) forming a plurality of polysilicon lines, having a desired spacing and a desired aspect ratio, on a semiconductor material;
   (b.) forming active areas in regions of said semiconductor material;
   (c.) depositing a layer of undoped silicate glass over said plurality of polysilicon lines, using a high-density plasma chemical vapor deposition process;
   (d.) depositing a layer of phosphorous-doped silicate glass having a phosphorous doping of between about 2 and 4 percent wt over said layer of undoped silicate glass, using a high-density plasma chemical vapor deposition process;
   (e.) forming metallization lines on said layer of phosphorous-doped silicate glass;

whereby said method provides gap-fill and planarization which is superior to that provided by a plasma-enhanced chemical vapor deposition process.

13. A method of fabricating an integrated circuit structure, comprising the steps of:
   (a.) forming a plurality of polysilicon lines having a desired spacing and a desired aspect ratio;
   (b.) depositing a layer of doped silicate glass having a phosphorous doping of greater than or equal to two percent wt over said plurality of polysilicon lines, using a high-density plasma chemical vapor deposition process;
      whereby said method provides gap-fill and planarization which is superior to that provided by a plasma-enhanced chemical vapor deposition process.

14. A method of fabricating an integrated circuit structure, comprising the steps of:
   (a.) forming a plurality of polysilicon lines having a desired spacing and a desired aspect ratio;
   (b.) depositing a layer of doped silicate glass having a phosphorous doping of less than or equal to four percent wt over said plurality of polysilicon lines, using a high-density plasma chemical vapor deposition process;
      whereby said method provides gap-fill and planarization which is superior to that provided by a plasma-enhanced chemical vapor deposition process.

15. A method of fabricating an integrated circuit structure, comprising the steps of:
   (a.) forming a plurality of polysilicon lines, having a desired spacing and a desired aspect ratio, on a semiconductor material;
   (b.) forming active areas in regions of said semiconductor material;
   (c.) depositing a layer of undoped silicate glass over said plurality of polysilicon lines, using a high-density plasma chemical vapor deposition process;
   (d.) depositing a layer of phosphorous-doped silicate glass over said layer of undoped silicate glass, using a high-density plasma chemical vapor deposition process with a temperature less than 350° C.;
   (e.) forming metallization lines on said layer of phosphorous-doped silicate glass;
      whereby said method provides gap-fill and planarization which is superior to that provided by a plasma-enhanced chemical vapor deposition process.

* * * * *